United States Patent [19]

Nagashima

[11] Patent Number: 4,625,220

[45] Date of Patent: Nov. 25, 1986

[54] MONITORING APPARATUS FOR LIQUID JET RECORDING HEAD

[75] Inventor: Yoshitake Nagashima, Chigasaki, Japan

[73] Assignee: Canon Kabushiki Kaisha, Tokyo, Japan

[21] Appl. No.: 667,364

[22] Filed: Nov. 1, 1984

[30] Foreign Application Priority Data

Nov. 10, 1983 [JP] Japan .......................... 58-173818[U]

[51] Int. Cl.⁴ ...................... G01D 15/16; H01L 41/04

[52] U.S. Cl. ................................ 346/140 R; 310/317

[58] Field of Search .......................... 346/140 PD, 75; 310/317, 326

[56] References Cited

U.S. PATENT DOCUMENTS 4,051,426 9/1977 Wood ................................ 310/317

4,184,168 1/1980 Isayama ...................... 346/140 PD

FOREIGN PATENT DOCUMENTS 55-90372 8/1980 Japan ........................... 346/140 PD

*Primary Examiner*—E. A. Goldberg

*Assistant Examiner*—Mark Reinhart

*Attorney, Agent, or Firm*—Fitzpatrick, Cella, Harper & Scinto

[57] ABSTRACT

Liquid jet apparatus comprises: a liquid jet head having an electrical-mechanical transducing element to discharge a liquid; a drive circuit for supplying a driving signal to the electrical-mechanical transducing element; a directional coupling circuit provided between the electrical-mechanical transducing element and the drive circuit; and a detecting circuit for detecting an electric power which is generated in the electrical-mechanical transducing element through the directional coupling circuit.

14 Claims, 4 Drawing Figures

MONITORING APPARATUS FOR LIQUID JET RECORDING HEAD

BACKGROUND OF THE INVENTION

1. Field of the Invention

The present invention relates to liquid jet apparatus provided with monitoring means which can observe the operating state of a liquid jet head such as an ink jet head or the like by a simple constitution.

2. Description of the Prior Art

Liquid jet recording apparatuses such as ink jet recording apparatuses or the like can be divided into three kinds of known apparatuses: electrostatic suction type; pressure jet type; and pressure pulse type. The former two types can easily observed as to their operating states since the control is performed by charging ink particles. However, they are not particularly suitable for use in a small-sized printer because the apparatus itself is large and is difficult to make relatively free maintenance.

On the other hand, the third pressure pulse type, particulary a drop on-demand type apparatus, is suitable for miniaturization and enables realization of a light-weight apparatus. This type of apparatus is constituted in a manner such that, for example, an electrical-mechanical transducing element such as a piezoelectric element or the like is provided to surround a nozzle part of a liquid jet head, and a voltage pulse is applied to this electrical-mechanical transducing element in order to allow a pressure wave to be generated, thereby causing a recording liquid such as an ink or the like to be discharged from the nozzle part.

In such a pressure pulse type apparatus, a problem is caused because it is difficult to provide monitoring means with high reliability and simple constitution for detecting the abnormal operation and performing processing to recover normal operation. For instance, a method has been proposed whereby two kinds of piezoelectric transducing elements for driving and detecting the operating state are provided for one head (refer to Japanese Patent Application Laid-open Publication No. 32572/1979). However, this method also has drawbacks, such as increased manufacturing cost since the constitution of the head complicated, and difficulties in designing structure to obtain optimum liquid jet characteristics.

SUMMARY OF THE INVENTION

It is therefore a main object of the present invention to provide a liquid jet apparatus which is provided with monitoring means which can certainly detect the operating state of a liquid jet head which is controlled by an electrical-mechanical transducing element without modifying a constitution of the head itself.

Another object of the invention is to provide a liquid jet apparatus which is provided with head monitoring means which can be cheaply constituted without making the constitution of the head complicated and without making the liquid jet characteristic of the head deteriorate.

According to an embodiment embodying the aspect of the invention under these objects, a liquid jet apparatus comprises: a liquid jet head including an electrical-mechanical transducing element to discharge a liquid; a driver to supply a driving signal to the electrical-mechanical transducing element; a directional coupler provided between the electrical-mechanical transducing element and the driver; and a detecting circuit to detect an electric power which is generated by the electrical-mechanical transducing element through the directional coupler.

Further other objects, features and advantages of the present invention will become apparent from the following detailed description with reference to the accompanying drawings.

BRIEF DESCRIPTION OF THE DRAWINGS

A preferred embodiment of the present invention will now be described hereinbelow with reference to the accompanying drawings, in which.

DETAILED DESCRIPTION OF THE PREFERRED EMBODIMENT

Figure 1:
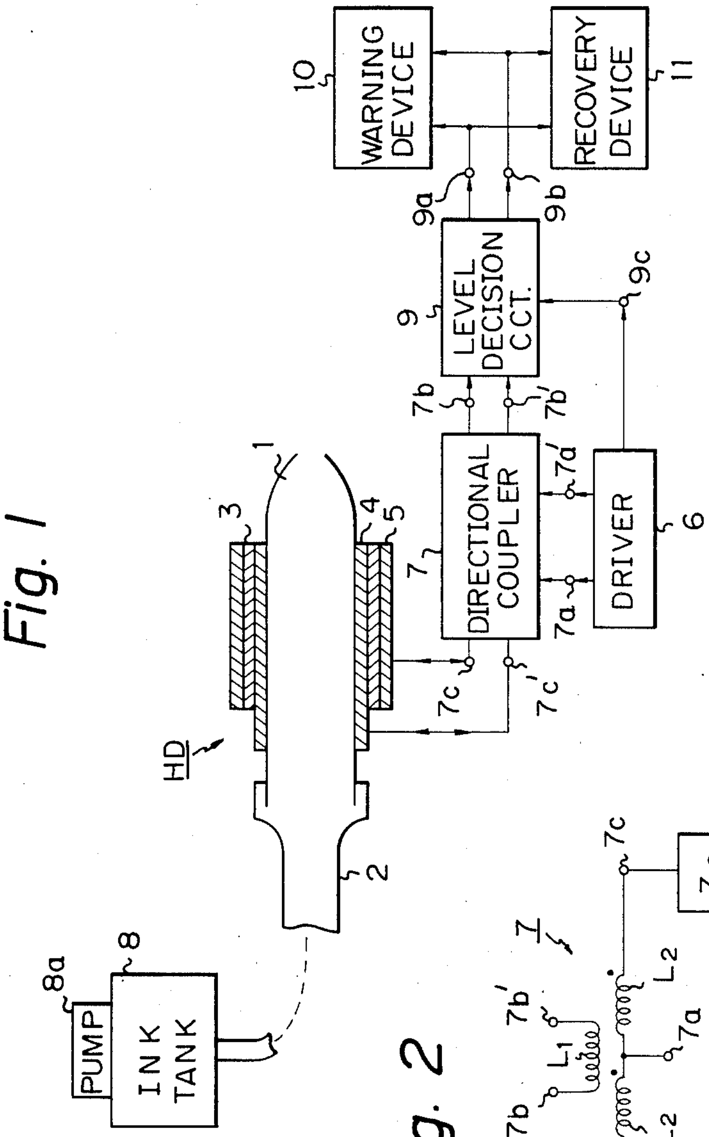
FIG. 1 is a block diagram showing one embodiment of the present invention.

FIG. 1 shows an embodiment in the case where the present invention is applied to an ink jet printer, in which a reference numeral 1 denotes a nozzle part of an ink jet head the whole section of which is indicated at HD; 2 is a tube for coupling the head 1 to an ink tank 8; 3 is an electrical-mechanical transducing element such as a piezoelectric element or electrostrictive element or the like (it is assumed that this element is a piezoelectric element in this example) provided to surround the nozzle part 1; 4 and 5 are electrodes of the electrical-mechanical transducing element 3; and 6 is a driver to supply a driving pulse (voltage pulse) to the electrical-mechanical transducing element 3. As is well known, the portion of the nozzle part 1 surrounded by the electrical-mechanical transducing element 3 constitutes a pressure chamber. This pressure chamber is contracted or expanded in response to the driving pulse which is applied to the electrical-mechanical transducing element 3, so that a pressure wave is generated, thereby causing an ink to be discharged from the point of the nozzle part 1 and allowing recording to be performed.

Numeral 7 denotes a directional coupler connected between the driver 6 and the electrodes 4 and 5 of the electrical-mechanical transducing element 3. A level decision circuit 9 as an example of a detecting circuit is connected between third terminals *7b* and *7b'* of the directional coupler 7.

Figure 2:
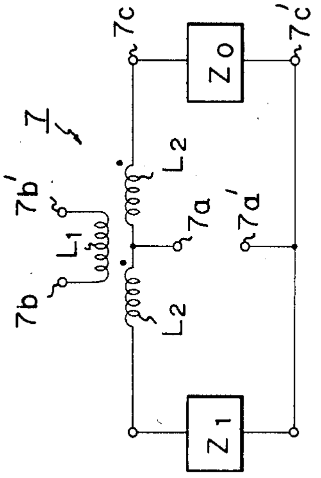
FIG. 2 is a circuit diagram showing the details of a directional coupler in FIG. 1.

The directional coupler 7 may be constituted by a circuit, for example, shown in FIG. 2. In FIG. 2, coils $L_1$ and $L_2$ are inductively coupled. The coil $L_2$ is divided into two parts and their directions are as shown in the diagram. $Z_0$ is a load and $Z_1$ is a dummy. Now, assuming that $Z_0=Z_1$, equal currents flow through the load $Z_0$ and dummy $Z_1$ with respect to the voltage which is applied between terminals *7a* and *7a'*, so that no voltage is developed in the coil $L_1$. On the other hand, with respect to the voltage generated between both ends of the load $Z_0$, a current flows in series through the coil $L_2$ and dummy $Z_1$, so that this causes a voltage to be generated in the coil $L_1$. That is, this is the principle of the directional coupling. In the relation with the apparatus of FIG. 1, the driver 6 is connected to the terminals *7a* and *7a'* and the driving pulse is applied to the terminals 7*a* and 7*a*'. The level decision circuit 9 is connected to the terminals 7*b* and 7*b*'. The load $Z_0$ between terminals 7*c* and 7*c*' corresponds to the electrical-mechanical transducing element 3.

Figure 3:
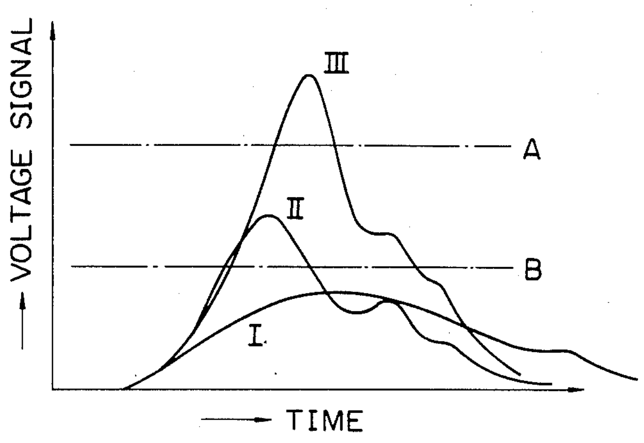
FIG. 3 is a diagram showing characteristics of an electric power which is generated by an electrical-mechanical transducing element in FIG. 1.

Next, the operation of the apparatus of FIG. 1 will be explained. When the electrical-mechanical transducing element 3 is deformed due to the above the driving pulse, an electric power is generated in the transducing element 3 in response to the deformation. This electric power changes in dependence upon the operating state of the ink jet head HD. In the arrangement of FIG. 1, the voltage signal responsive to the above electric power generated in the electrical-mechanical transducing element 3 is separated from the driving pulse from the driving signal source 3 due to the existence of the directional coupler 7 and is outputted at the terminals 7*b* and 7*b*' on the detecting circuit side. The characteristic acoustic impendance of this voltage signal varies depending upon the operating state of the ink jet head HD, so that the output characteristic changes. FIG. 3 shows the situation of such a change, in which I denotes the state in that an air bubble was mixed into the ink or represents the substantial absence of ink in the ink tank 8; II shows the normal state; and III denotes the state in that the nozzle part 1 is choked due to solidification of ink or the like.

Figure 4:
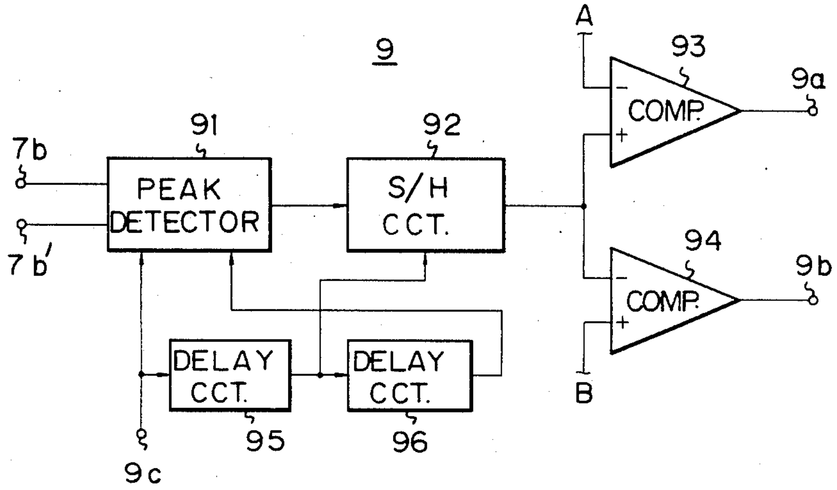
FIG. 4 is a block diagram showing the details of a level decision circuit in FIG. 1.

The above voltage signal is inputted to the level decision circuit 9 and the peak of voltage is checked to see if it lies within the range which was set by reference levels A and B, thereby enabling the presence of an abnormality of the head HD and the kind of such abnormality to be known. As the decision circuit 9, an arrangement as shown in, e.g., FIG. 4 can be adopted. Namely, in the diagram, the voltage appearing between the output terminals 7*b* and 7*b*' of the directional coupler 7 is applied to a peak detector 91, by which the peak value is detected. The peak detector 91 operates in response to a detection command signal which is applied to a terminal 9*c*. In the embodiment, this command signal is outputted from the driver 6 of FIG. 1 synchronously with the timing at which the driving pulse is applied to the electrical-mechanical transducing element 3. An output of the peak detector 91, that is, the detected peak value is sampled and held by a sample and hold circuit 92. The signal of which the detection command signal which is applied to the terminal 9*c* was delayed by a first delay circuit 95 is applied as a sampling command signal to the sample and hold circuit 92. On one hand, the sampling command signal, namely, an output of the first delay circuit 95 is further delayed by a second delay circuit 96 and thereafter it is applied as a reset signal to the peak detector 91.

The output of the sample and hold circuit 92 is applied to a non-inverting input of a first voltage comparator 93 to which the above-mentioned reference level A was applied at its inverting input, and at the same time the output of the circuit 92 is applied to an inverting input of a second voltage comparator 94 to which the above-mentioned reference level B was applied at its non-inverting input.

Therefore, with respect to the voltage signal I described in FIG. 3 (indicating the mixture of air bubble into the ink or the substantial absence of ink in the ink tank 8), an output of the comparator 93 is at a low level but an output of the comparator 94 is at a high level. On one hand, with respect to the voltage signal II (representative of the normal state), both outputs of the comparators 93 and 94 become a low level. With respect to the voltage signal III (indicating that the nozzle part 1 is choked), the output of the comparator 94 becomes a low level but the output of the comparator 93 becomes a high level.

The result of decision by the level decision circuit 9, i.e., the respective results of comparison by the comparators 93 and 94 are outputted to output terminals 9*a* and 9*b*, respectively. These output signals are applied to a warning device 10 and recovery device 11 shown in FIG. 1. For instance, the warning device 10 indicates that the nozzle part 1 of the head HD is choked in response to the high output from the comparator 93 appearing at the terminal 9*a*; indicates that an air bubble is mixed into the ink in response to the high output from the comparator 94 appearing at the terminal 9*b*; or indicates the substantial absence of ink in the ink tank 8 that can be a main cause of them. On the other hand, the recovery device 11 makes a pressure pump 8*a* attached to the ink tank 8 operative, for instance, in order to eliminate the choking of the nozzle part 1 in response to the high output at the terminal 9*a* or allows an ink suction device (not shown) to act on the nozzle 1; or supplements an ink by connecting an ink supply source (not shown) to the ink tank 8 in response to the high output at the terminal 9*b*.

As described in detail in the above, according to the invention, the directional coupler is connected between the electrical-mechanical transducing element to drive the liquid jet head and the driver to supply the driving signal to the electrical-mechanical transducing element, and the detecting circuit to detect the electromotive force which is generated in the electrical-mechanical transducing element is connected through the directional coupler. Therefore, the operating state of the head can be detected through the electrical-mechanical transducing element for driving the head without modifying the constitution of the liquid jet head. Thus, the overall liquid jet apparatus can be monitored by a simple arrangement and its maintenance becomes easy.

Clearly, various changes and modifications of the invention other than the foregoing embodiments are possible. For instance, any other means than the directional coupler shown in FIG. 2 may be used. Further, it is possible to obtain a device to detect the choking of the nozzle by use of only the comparator 93 between the comparators 93 and 94 in FIG. 4. Also, a device to detect the absence of ink in the ink tank may be derived by use of only the comparator 94. It is also possible to modify the detecting device so as to detect other states of the apparatus as necessary.

For example, in the case where there are a plurality of heads HD, it is possible to adopt the arrangement whereby a plurality of circuits indicated at 6, 7 and 9 are provided in accordance with the number of heads and then the output of each level decision circuit 9 is connected to the warning device 10 and recovery device 11 through an OR circuit, or the arrangement whereby the level decision circuit 9 is commonly used and the output of each directional coupler 7 is connected to the common level decision circuit 9 through an analog OR circuit, or the like.

What I claim is:

1. A liquid jet apparatus comprising:

a liquid jet head having an electrical-mechanical transducing element for discharging liquid;

a drive circuit for driving said electrical-mechanical transducing element;

a directional coupling circuit including a dummy circuit whidh had a load corresponding to the load of said electrical-mechanical transducing element, a first connection circuit for connecting said transducing element with said drive circuit, a second connection circuit for connecting said dummy circuit with said drive circuit and a voltage generation circuit for generating a voltage corresponding to any voltage difference which may exist between the voltages across said transducing element and said dummy circuit; and a detecting circuit for detecting via said voltage generation circuit the value of the voltage generated from said electrical-mechanical transducing element.

2. An apparatus according to claim 1, wherein said detecting circuit includes a comparator for comparing a voltage value which generated from said electrical-mechanical transducing element with a predetermined reference level.

3. An apparatus according to claim 2, wherein said detecting circuit further includes:

a peak detector for detecting a peak value of said voltage, and said comparator compares the peak value of the voltage detected by said peak detector with the reference level.

4. An apparatus according to claim 1, wherein said detecting circuit includes a plurality of comparators for respectively comparing voltage value generated from said electrical-mechanical transducing element with mutually different reference levels.

5. An apparatus according to claim 4, wherein said detecting circuit further includes:

a peak detector for detecting a peak value of said voltage;

said comparators respectively compare the peak value of the voltage detected by said peak detector with the respective reference levels.

6. An ink jet printer comprising:

an ink jet head having an electrical-mechanical transducing element and a nozzle for discharging ink;

a drive circuit for driving said electrical-mechanical transducing element;

a directional coupling circuit including a dummy circuit which has a load corresponding to the load of said electrical-mechanical transducing element, a first connection circuit for connecting said transducing element with said drive circuit, a second connection circuit for connecting said dummy circuit with said drive circuit and a voltage generation circuit for generating a voltage corresponding to any voltage difference which may exist between the voltages across said transducing element and said dummy circuit; and a detecting circuit for detecting a choking of the nozzle of said head on the basis of an output voltage from said voltage generation circuit of said directional coupling circuit.

7. A printer according to claim 6, wherein said detecting circuit includes a comparator for comparing the output voltage from said directional coupling circuit with a predetermined reference level.

8. A printer according to claim 7, wherein said detector further includes:

a peak detector for detecting a peak value of the output voltage from said directional coupling circuit, and said comparator compares the peak value of the voltage detected by said peak detector with the reference level.

9. A printer according to claim 8, wherein said detecting circuit outputs a characteristic signal indicating a choking of said nozzle when the peak value of the output voltage from said directional coupling circuit exceeds the reference level.

10. An ink jet printer comprising:

an ink jet head having an electrical-mechanical transducing element and a nozzle for discharging ink;

an ink tank for supplying ink to said head;

a drive circuit for driving said electrical-mechanical transducing element;

a directional coupling circuit including a dummy circuit which has a load corresponding to the load of said electrical-mechanical transducing element, a first connection circuit for connecting said transducing element with said drive circuit, a second connection circuit for connecting said dummy circuit with said drive circuit, and a voltage generation circuit for generating a voltage corresponding to any voltage difference which may exist between the voltages across said transducing element and said dummy circuit; and a detecting circuit for detecting a substantial absence of ink in said ink tank on the basis of an output voltage from said voltage generation circuit of said directional coupling circuit.

11. A printer according to claim 10, wherein said detecting circuit includes a comparator for comparing the output voltage from said directional coupling circuit with a predetermined reference level.

12. A printer according to claim 11, wherein said detector further includes:

a peak detector for detecting a peak value of the output voltage from said directional coupling circuit, and said comparator compares the peak value of the voltage detected by said peak detector with the reference level.

13. A printer according to claim 12, wherein said detecting circuit outputs a characteristic signal indicating a substantial absence of ink in said ink tank when the peak value of the output voltage from said directional coupling circuit becomes lower than the reference level.

14. A liquid jet apparatus comprising:

a liquid jet head having an electrical-mechanical transducing element for discharging liquid;

a drive circuit for driving said electrical-mechanical transducing element;

a directional coupling circuit provided between said electrical-mechanical transducing element and said drive circuit, said directional coupling circuit comprising a load circuit which includes said transducing element, a dummy circuit which has a load corresponding to the load of said transducing element and a voltage generation circuit for generating a voltage corresponding to any voltage difference which may exist between the voltages across said load circuit and said dummy circuit;

a detection circuit for detecting via said voltage generation circuit of said directional coupling circuit the value of the voltage generated from said electrical-mechanical transducing element.

* * * * *